(12) United States Patent
Zhen et al.

(10) Patent No.: US 7,903,592 B2
(45) Date of Patent: Mar. 8, 2011

(54) SYSTEMS AND METHODS OF EFFICIENT BAND AMPLIFICATION

(75) Inventors: Liping Zhen, Meriden, CT (US); Xiangqing Xu, Meriden, CT (US)

(73) Assignee: Alcatel Lucent, Paris (FR)

( * ) Notice: Subject to any disclaimer, the term of this patent is extended or adjusted under 35 U.S.C. 154(b) by 825 days.

(21) Appl. No.: 11/681,392

(22) Filed: Mar. 2, 2007

(65) Prior Publication Data

US 2008/0212500 A1    Sep. 4, 2008

(51) Int. Cl.
*H04L 5/14* (2006.01)
(52) U.S. Cl. .............. 370/295; 455/63.1; 455/550.1; 455/552.1; 370/276; 370/277; 370/282
(58) Field of Classification Search .......... 455/550.1, 455/552.1; 370/276, 277, 282
See application file for complete search history.

(56) References Cited

U.S. PATENT DOCUMENTS

| | | | |
|---|---|---|---|
| 6,005,884 A * | 12/1999 | Cook et al. ............. 375/132 |
| 6,128,508 A * | 10/2000 | Francisco et al. ....... 455/552.1 |
| 6,195,561 B1 * | 2/2001 | Rose ...................... 455/523 |
| 6,980,067 B2 * | 12/2005 | Forrester et al. .......... 333/133 |
| 7,454,170 B2 * | 11/2008 | Goossens et al. ......... 455/41.1 |
| 2003/0062971 A1 * | 4/2003 | Toncich ................... 333/202 |
| 2003/0068998 A1 * | 4/2003 | Yamakawa et al. ....... 455/339 |
| 2003/0153279 A1 * | 8/2003 | Kang et al. ............... 455/83 |
| 2003/0189910 A1 * | 10/2003 | Yamada et al. ........... 370/335 |
| 2004/0005913 A1 * | 1/2004 | Bollenbeck ............ 455/562.1 |
| 2004/0052272 A1 * | 3/2004 | Frank .................... 370/458 |
| 2004/0113720 A1 * | 6/2004 | Komuro et al. .......... 333/133 |
| 2004/0196121 A1 * | 10/2004 | Toncich ................. 333/207 |
| 2005/0197078 A1 * | 9/2005 | Yoshimoto ............ 455/127.4 |
| 2006/0279362 A1 * | 12/2006 | Chang et al. ........... 330/302 |
| 2007/0030095 A1 * | 2/2007 | Hikita et al. ............ 333/133 |
| 2007/0077898 A1 * | 4/2007 | Mueller et al. ........... 455/83 |
| 2008/0175175 A1 * | 7/2008 | Oren et al. .............. 370/279 |
| 2008/0205548 A1 * | 8/2008 | Rofougaran ............ 375/297 |
| 2008/0212502 A1 * | 9/2008 | Zhen et al. .............. 370/295 |
| 2008/0259438 A1 * | 10/2008 | Krylov et al. ............ 359/349 |

* cited by examiner

*Primary Examiner* — Matthew D Anderson
*Assistant Examiner* — Erica Fleming-Hall
(74) *Attorney, Agent, or Firm* — Kramer & Amado, PC (57) ABSTRACT

Systems and methods for multi-band amplification. In an exemplary embodiment of the present invention, the multi-band amplification device has an uplink amplifier with a first port and a second port and a downlink amplifier with a first port and a second port. Furthermore, the multi-band amplification device has a first duplexer device in communication with the first port of the downlink amplifier and the second port of the uplink amplifier and a second duplexer device in communication with the first port of the uplink amplifier and the second port of the downlink amplifier. The first duplexer device is enabled to receive and transmit at least a downlink signal and an uplink signal of a first frequency band, a downlink signal and an uplink signal of a second frequency band, and a downlink signal and an uplink signal of a third frequency band. The second duplexer device is enabled to receive and transmit at least the downlink signal and the uplink signal of the first frequency band, the downlink signal and the uplink signal of the second frequency band, and the downlink signal and the uplink signal of the third frequency band.

14 Claims, 9 Drawing Sheets

FIG. 7B

SYSTEMS AND METHODS OF EFFICIENT BAND AMPLIFICATION

CROSS-REFERENCE TO RELATED APPLICATION(S)

This application discloses subject matter related to the subject matter disclosed in commonly owned, co-pending U.S. patent application Ser. No. 11/681,405 (Alcatel Lucent reference no. 132828), entitled "SYSTEMS AND METHODS OF BAND AMPLIFICATION WITH A SHARED AMPLIFIER", filed, Mar. 2, 2007, in the names of Liping Zhen and Xiangqing Xu, which is hereby incorporated by reference in its entirety for all purposes.

TECHNICAL FIELD

The present invention relates generally to a system and method of band amplification, and, in particular, to a system and method of wireless communication band amplification with reduced power loss, gain loss, and reduced noise.

BACKGROUND OF THE INVENTION

The proliferation of the wireless telecommunications into every sector of business and all facets of personal life and daily activity have far exceeded any initial projections. Wireless communication has become a staple for conducting business in many industries and represents a significant portion of all telecommunications. As wireless communication, and the devices which enable it, become more widely integrated into everyday activities, the demand for wireless service coverage greatly expands.

Wireless subscribers and wireless service providers often rely upon band amplifiers to expand and extend wireless coverage. For example, an in-building amplifier can be installed to increase signal reception and transmission for wireless subscribers in a particular office facility. Most wireless communication amplifiers are bidirectional and thus have capability of amplifying both uplink and downlink wireless signals such that both the reception to the subscriber and the transmission to the base station are improved.

Wireless amplifiers can be used in a variety of implementations, including providing extended service areas directly to wireless subscribers and amplifying signals passing between nodes in a wireless network. For example, wireless bidirectional amplifiers can be used to amplify signals passing between two parts of the wireless system, such as the base station and local service area. As the subscriber demand for wireless services increases, the necessity for inexpensive, efficient, and reliable equipment to provide that service increases.

Figure 1:
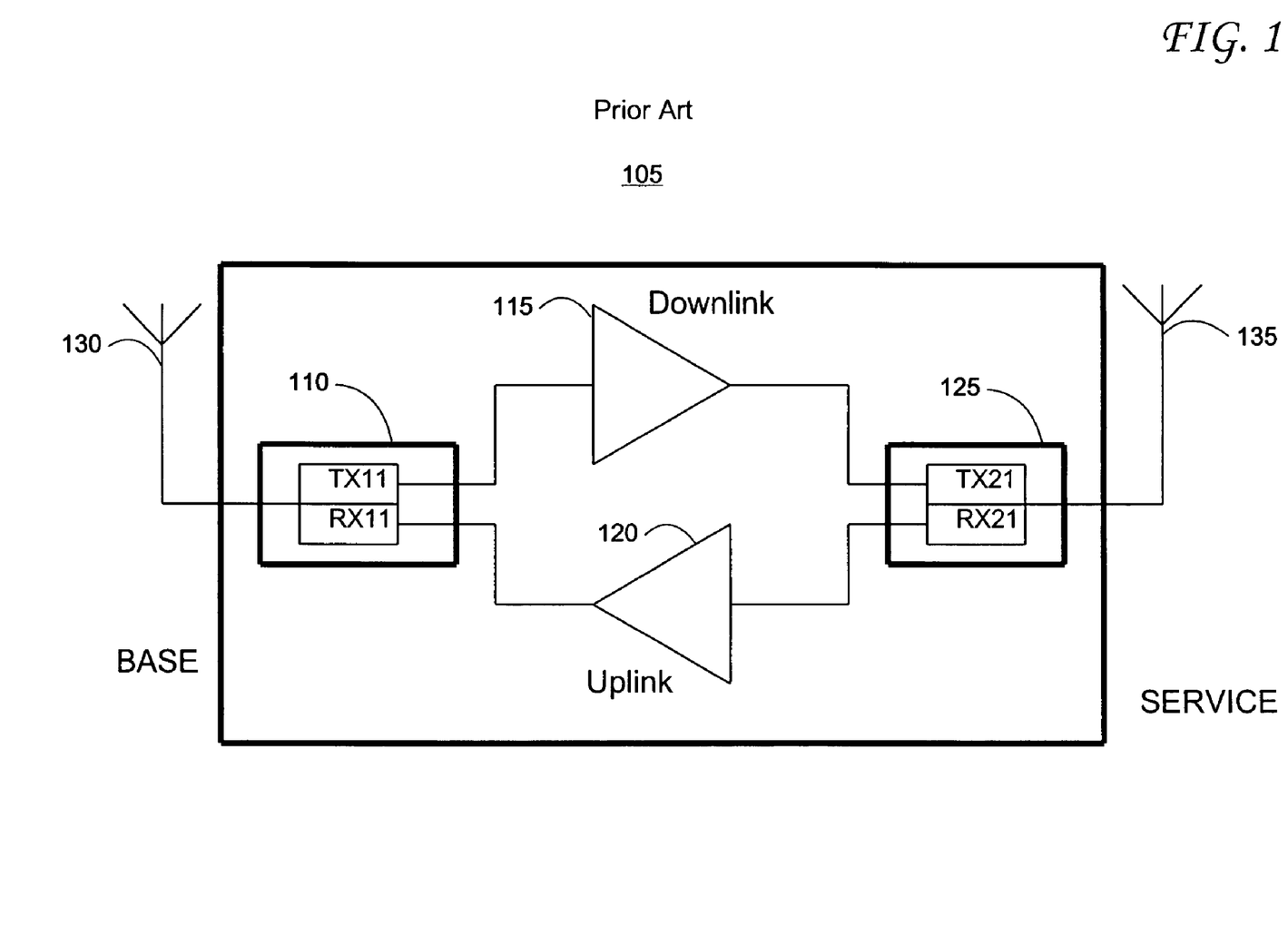
FIG. 1 illustrates a prior art single band bidirectional amplifier.

In the past, wireless communication systems were often covered by one frequency band. Therefore, the wireless bidirectional amplifiers used in these systems were only required to process one frequency band. FIG. 1 shows a conventional single band bidirectional amplifier 105. The conventional single band bidirectional amplifier 105 includes an uplink amplifier 120 and a downlink amplifier 115. The uplink amplifier 120 processes the signals received from the service antenna, antenna 135, to be transmitted via the base antenna 130. Similarly, the downlink amplifier 115 processes the signals received from the base antenna, antenna 130, to be transmitted via the service antenna, antenna 135. Duplexers are provided to pass the transmitted and received signals of the amplifier 105. For example, a signal received at antenna 130 is passed to duplexer 110 and likewise the duplexer 110 passes a signal to be transmitted to antenna 130. The duplexer 110 passes transmission signal, Tx1, through its TX11 filter to the input port of the downlink amplifier 115. The duplexer 110 also receives the received signal, Rx1, through its RX11 filter from the output port of the uplink amplifier 120. Similarly, duplexer 125 passes the uplink signal received from antenna 135 to the input port of the uplink amplifier 120 and passes the downlink signal received from downlink amplifier 115 to antenna 135 for transmission to the service area.

Figure 2:
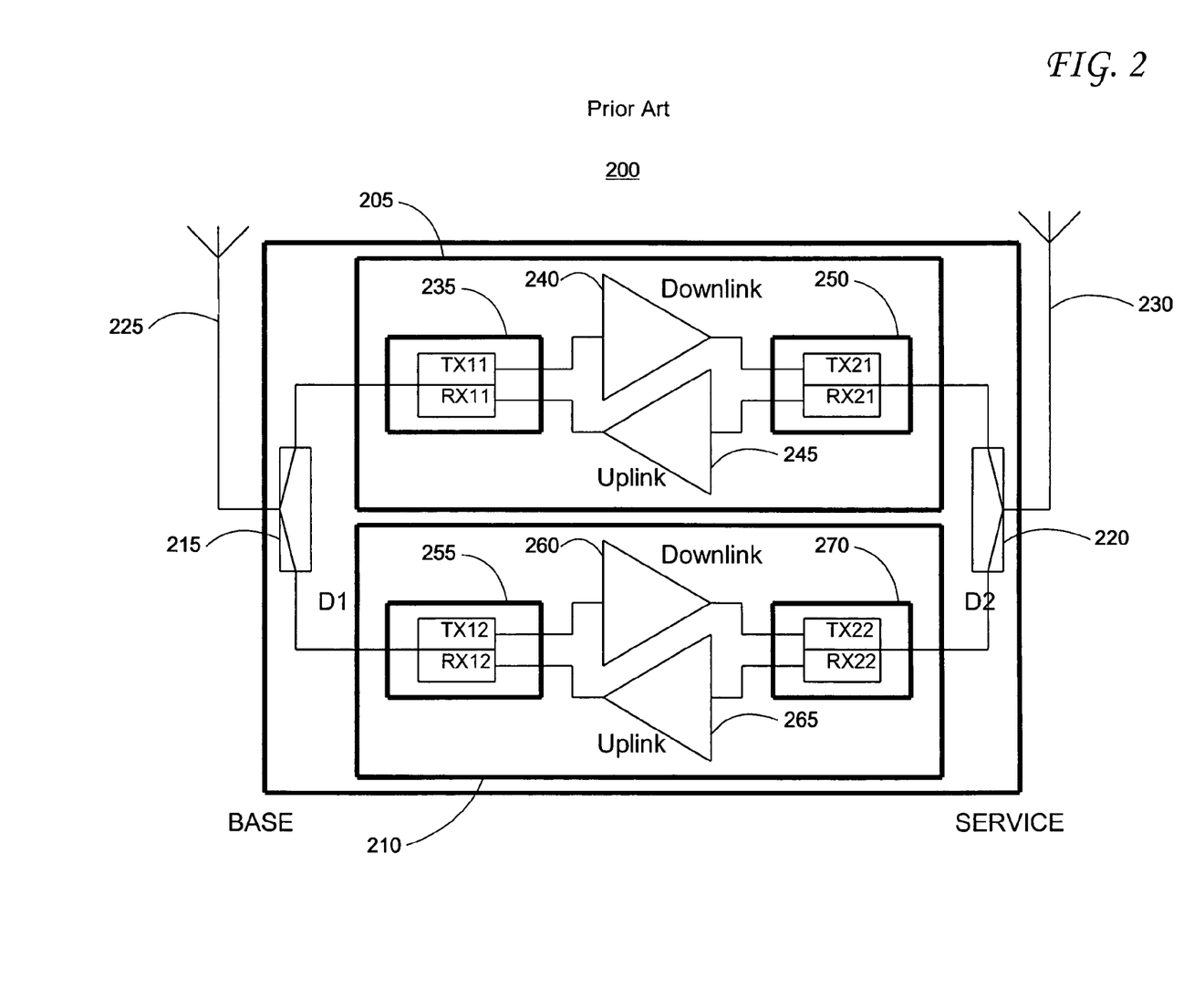
FIG. 2 illustrates a prior art dual band bidirectional amplifier.

Unlike the single band systems, more modern wireless telecommunication networks transmit signals over multiple frequency bands. To provide signal coverage for systems operating in two frequency bands, dual band bidirectional amplifiers were designed. Conventional dual band bidirectional amplifiers are constructed from two single band bidirectional amplifiers, such as 105, connected by two power dividers. FIG. 2 provides an illustration of a conventional dual band bidirectional amplifier 200. The two single band bidirectional amplifiers, 205 and 210, are provided as the central components of bidirectional amplifier 200. Two power dividers, 215 and 220, provide signal path for the two frequency bands transmitted and received by antenna 225 and antenna 230 into the bidirectional amplifiers 205 and 210.

Similar to the amplifier shown in FIG. 1, the first single band bidirectional amplifier 205 includes a duplexer 235, a downlink amplifier 240, an uplink amplifier 245, and a duplexer 250. The duplexer 235 passes transmission signal, Tx1, through its TX11 filter to the input port of the downlink amplifier 240. The duplexer 235 also receives the amplified uplink signal, Rx1, through its RX11 filter from the output port of the uplink amplifier 245. Similarly, duplexer 250 passes the uplink signal, Rx1, through its RX21 filter received from power divider 220 to the input port of the uplink amplifier 245 and passes the amplified downlink signal, Tx1, through its TX21 filter received from downlink amplifier 240 to power divider 220 for transmission via antenna 230.

The second single band bidirectional amplifier 210 is provisioned in a manner similar to that of the first single band bidirectional amplifier 205, such that it includes a duplexer 255, a downlink amplifier 260, an uplink amplifier 265, and a duplexer 270. The duplexers, 255 and 270, pass the received and transmitted signals to the appropriate amplifier, 260 or 265.

While suitable for its intended purposes, the conventional dual band bidirectional amplifier 200 depicted in FIG. 2 suffers from a number of drawbacks. Significantly, the addition of the power dividers, 215 and 220, to the circuit inserts a large amount of loss and noise into the amplifier device. For example, in one embodiment the system gain for the dual band bidirectional amplifier 200 is 6 dB lower than in the single band bidirectional amplifier 100 configuration due to the additional loss of the power dividers, 215 and 220. Furthermore, in that embodiment the power dividers, 215 and 220, reduce the output power by 3 dB and increase the noise figure by 3 dB. An additional drawback to the dual band bidirectional amplifier 200 depicted in FIG. 2 relates to the cost of the device. As illustrated in FIG. 2, the dual band amplifier 200 configuration involves more than double the components of the single band amplifier 100 configuration; thus, the cost of the dual band amplifier 200 is more than double. As with any network element, cost is a large factor and one that can potentially be implementation prohibitive with respect to wireless telecommunication systems.

Figure 3:
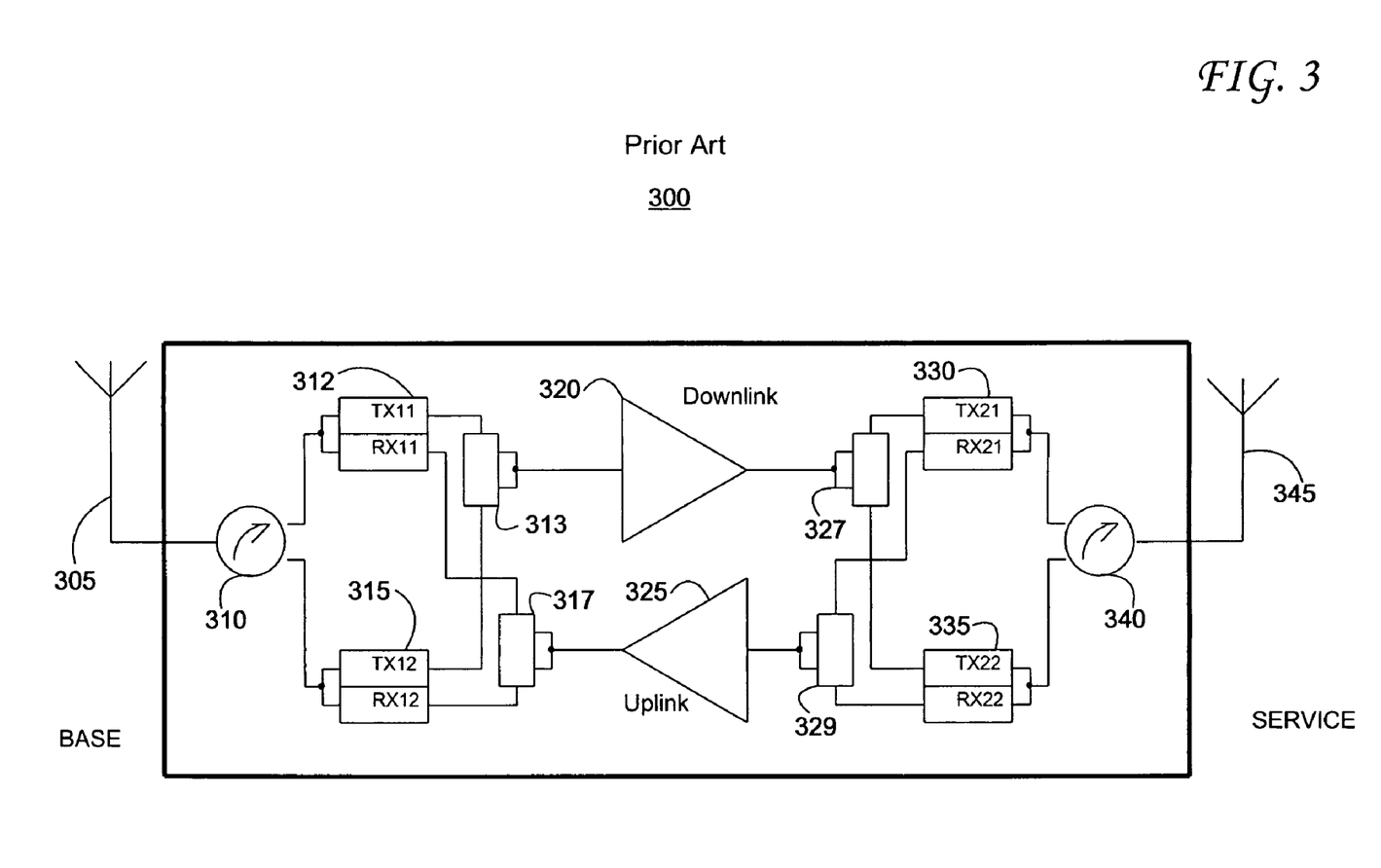
FIG. 3 illustrates a prior art dual band bidirectional amplifier.

To overcome the drawbacks associated with designs like the dual band bidirectional amplifier 200, amplifiers were designed in an attempt to limit power loss and cost of the device. FIG. 3 is an illustration of an improved dual band bidirectional amplifier 300 as described in U.S. Pat. No. 6,993,286. The dual band bidirectional amplifier 300 is capable of amplifying signals in two frequency bands from antenna 305 and antenna 345 with only one amplifier chain. More particularly, whereas the dual band bidirectional amplifier 200 shown in FIG. 2 required two downlink amplifiers, 240 and 260 and two uplink amplifiers, 245 and 265, the dual band bidirectional amplifier 300 shown in FIG. 3 requires only one downlink amplifier 320 and one uplink amplifier 325.

In FIG. 3, downlink signals, are received at the base antenna 305. These downlink signals are passed to a first circulator 310. The circulator 310 is responsible for distributing the downlink signals to the appropriate duplexer. It also passes the uplink signals to transmit at the base antenna 305.

Duplexer 312 is configured to pass the uplink signal, Rx1, and downlink signal, Tx1, in the first frequency band. It routes the downlink signal, Tx1, from circulator 310 to the input port of downlink amplifier 320 via T-cable 313. It also routes the amplified uplink signal Rx1, from the output port of uplink amplifier 325 via T-cable 317 to circulator 310. Duplexer 315, on the other hand, is configured to pass the uplink signal, Rx2, and downlink signal, Tx2, in the second frequency band. It routes downlink signal, Tx2, from circulator 310 to the input port of downlink amplifier 320 via T-cable 313. It also routes the amplified uplink signal, Rx2, from output port of uplink amplifier 325 via T-cable 317 to circulator 310.

As illustrated in the FIG. 3, on the service side of the device, the duplexers, 330, works similarly to Duplexer 312. It is configured to pass the uplink signal, Rx1, and downlink signal, Tx1 of the first frequency band. It routes the uplink signal, Rx1, from circulator 340 to the input port of uplink amplifier 325 via T-cable 329. It also routes the amplified downlink signal Tx1, from the output port of downlink amplifier 320 via T-cable 327 to circulator 340. Duplexer 335, on the other hand, works similarly to Duplexer 315. It is configured to pass the uplink signal, Rx2, and downlink signal, Tx2, in the second frequency band. It routes uplink signal, Rx2, from circulator 340 to the input port of uplink amplifier 325 via T-cable 329. It also routes the amplified downlink signal, Tx2, from output port of downlink amplifier 320 via T-cable 327 to circulator 340.

T-cable 313, and other similar T-cables in the device, 329, combine the signals from both frequency bands to be amplified by either the downlink amplifier 320 or the uplink amplifier 325. T-cable 317 and 327 feed the amplified signals of both frequency bands to respective duplexers, 312, 315, 330 and 335.

Circulator 340 passes the first frequency downlink signal, Tx1, with the second frequency downlink signal, Tx2, for transmission via antenna 345. It also distributes the first and second frequency uplink signals, Rx1 and Rx2, received from antenna 345 and routes them to the appropriate duplexer, either 330 or 335.

Dual band bidirectional amplifier 300 improves upon the design of previous dual band amplifiers by implementing a single wide band bidirectional amplifier chain having only one uplink amplifier 325 and one downlink amplifier 320. The wide band bidirectional amplifier chain is capable of amplifying both of the frequency bands of the system.

The design of dual band bidirectional amplifier 300 exhibits some superior characteristics in comparison to the design of dual band bidirectional amplifier 200. Due to the elimination of the power dividers, the dual band bidirectional amplifier 300 inserts less power loss and gain loss into the system. For example, in some implementations the output power of the dual band bidirectional amplifier 300 is 2 dB higher than the output power of dual band bidirectional amplifier 200. Additionally, the dual band bidirectional amplifier 300 exhibits improved sensitivity in comparison to other designs such as the dual band bidirectional amplifier 200. Furthermore, the dual band bidirectional amplifier 300 costs less than other designs due in large part to the face that it only requires one amplifier chain.

While the design of band amplifiers, such as dual band bidirectional amplifier 300, have been successful at overcoming some of the limitations and drawbacks of previous designs, there are some drawbacks that have been unaddressed. These unaddressed drawbacks are magnified by the increasing complexity of wireless telecommunication systems, especially if the systems operate with more than two frequency bands.

Therefore a need exists for a system or method that will address the limitations and drawbacks of the prior art band amplification devices.

Additionally, a need exists for a system or method to provide efficient band amplification in dual band wireless telecommunication systems.

Additionally, a need exists for a system or method to provide efficient band amplification in triple band wireless telecommunication systems.

Furthermore, a need exists to reduce system complexity and provide a cost effective device and power efficient device to band amplification in triple band wireless telecommunication systems.

BRIEF SUMMARY OF THE INVENTION

Briefly described, in a preferred form, the present invention is a system and method for providing band amplification with minimal components and minimal power loss. In an exemplary embodiment of the present invention, the multi-band amplification device has an uplink amplifier with a first port and a second port and a downlink amplifier with a first port and a second port. Furthermore, the multi-band amplification device has a first duplexer device in communication with the first port of the downlink amplifier and the second port of the uplink amplifier and a second duplexer device in communication with the first port of the uplink amplifier and the second port of the downlink amplifier. The first duplexer device is enabled to receive and transmit at least a downlink signal and an uplink signal of a first frequency band and a downlink signal and an uplink signal of a second frequency band. The second duplexer device is enabled to receive and transmit at least the downlink signal and the uplink signal of the first frequency band and the downlink signal and the uplink signal of the second frequency band.

These and other objects, features and advantages of the present invention will become more apparent upon reading the following specification in conjunction with the accompanying drawings.

DETAILED DESCRIPTION OF THE PREFERRED EMBODIMENTS

The present invention addresses the deficiencies in the prior art by providing a multi-band amplification device that is capable of efficiently amplifying signals in more than one band. In an exemplary embodiment of the present invention the multi-band amplification device does not require RF interconnecting components, such as circulators and T-cables, to route the multiple frequency bands to multiple duplexers. More particularly, the exemplary embodiment of the multi-band amplification device does not include power divider components. Furthermore, the exemplary embodiment of the multi-band amplification device has a power loss that is comparable to that of single band wireless amplification devices.

In an exemplary embodiment of the present invention, the multi-band amplification device has an uplink amplifier with a first port and a second port and a downlink amplifier with a first port and a second port. Furthermore, the multi-band amplification device has a first duplexer device in communication with the first port of the downlink amplifier and the second port of the uplink amplifier and a second duplexer device in communication with the first port of the uplink amplifier and the second port of the downlink amplifier. The first duplexer device receives and transmits at least a downlink signal and an uplink signal of a first frequency band and a downlink signal and an uplink signal of a second frequency band. The second duplexer device receives and transmits at least the downlink signal and the uplink signal of the first frequency band and the downlink signal and the uplink signal of the second frequency band.

Figure 4:
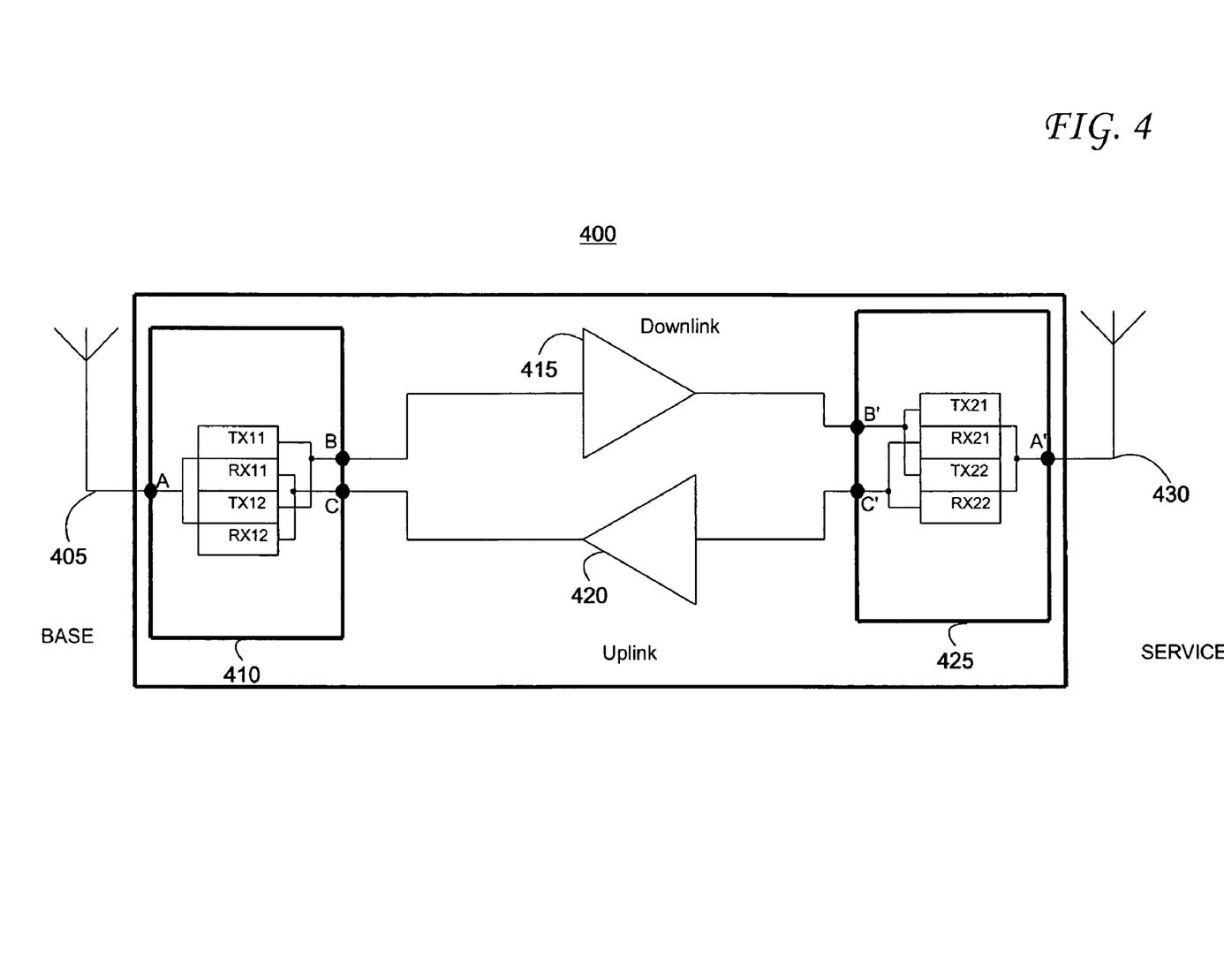
FIG. 4 displays a dual band bidirectional amplification device 400 in accordance with an exemplary embodiment of the present invention.

Referring now in detail to the drawing figures, wherein like reference numerals represent like parts throughout the several views, FIG. 4 displays a dual band bidirectional amplification device 400 in accordance with an exemplary embodiment of the present invention. As shown in FIG. 4, the dual band bidirectional amplification device 400 provides a device with less components than the dual band amplifiers of prior art, such as dual band bidirectional amplifier 200 in FIG. 2 or dual band bidirectional amplifier 300 in FIG. 3. Notably, the dual band bidirectional amplification device 400 contains two duplexer devices and one amplifier chain. In the exemplary embodiment depicted in FIG. 4, the dual band bidirectional amplification device 400 has duplexer device 410 and duplexer device 425, both are dual-duplexers with three ports. For example, duplexer device 410 has ports A, B, and C. The port A is a bidirectional common port capable of coupling four signals, the uplink and downlink signals of a first frequency band and the uplink and downlink signals of a second frequency band. Port B is an output port to transmit downlink signals of both frequency bands into the downlink amplifier 400. Port C is an input port that receives amplified uplink signals of both frequency bands from uplink amplifier 420.

Those of skill in the art will appreciate that the first frequency band and the second frequency band could be a variety of transmission and reception frequency ranges. Different wireless technologies utilize different transmission and reception frequencies and there are a large variety of different wireless technologies. In the U.S., the commonly used frequency bands in wireless communication include the 800 MHz, 900 MHz and 1900 MHz frequency bands. Different wireless systems can be implemented in these frequency bands. For example, a Specialized Mobile Radio Service (SMR) can be implemented in 800 MHz band or 900 MHz band, referred to as SMR800 and SMR900 respectively. Personal Cellular Service (PCS) can operate in the 1900 Mhz band, referred to as PCS1900.

With a large variation in wireless technologies and implementations, band amplification devices need to be able to process and amplify signals in a variety of frequencies. In a non limiting example of an embodiment of the dual band bidirectional amplification device 400, the first frequency band processed by the device may be in the 800 MHz range and the second frequency band processed by the device may be in the 900 MHz range. In another non limiting embodiment, the first frequency band may be in the 800 MHz and the second frequency band may be the 1900 MHz band.

The duplexer device 410, shown in FIG. 4, provides signal path for both the first frequency downlink and uplink signals and the second frequency downlink and uplink signals for antenna 405. Port A of the duplexer device 410 is a bidirectional port. In one direction, it couples the downlink signals, Tx1, of the first frequency band and, Tx2, of the second frequency band from antenna 405, and connects them to their respective filters, TX11 and TX12. In the other direction, it couples the uplink signals, Rx1 and Rx2, of both frequency bands from their respective filters, RX11 and RX12, to the antenna 405. Port B of duplexer device 410 can couple and match the downlink signals, Tx1 and Tx2, of both frequency bands to downlink amplifier 415. The reception port of duplexer device 410, Port C, is capable of coupling the two amplified uplink signals, Rx1 and Rx2, from uplink amplifier 420 and connecting them to their respective filters, RX11 and RX12.

Duplexer device 410 is configured to pass the uplink and downlink signals of the two desired frequency bands and can direct the signals such that each signal can only pass through its designated path. In a non-limiting example, the downlink signal, Tx1, of the first frequency band can be input at Port A and output at Port B of the duplexer device 410 through its TX11 filter, while the uplink signal, Rx1, of the first frequency band can be input at Port C and output at Port A through its RX11 filter. Similarly, the downlink signal, Tx2, of the second frequency band can be input at Port A and output at Port B of the duplexer device 410 through its TX12 filter and the uplink signal, Rx2, can be input at Port C and output at Port A through its RX12 filter.

In an exemplary embodiment, the duplexer device 425 on the service side of the dual band bidirectional amplification device 400 is implemented in much the same way as duplexer device 410. Like duplexer device 410, duplexer device 425 has three ports, A', B', and C'. The duplexer device 425, shown in FIG. 4, provides signal path for both the first frequency band uplink and downlink signals and the second frequency band uplink and downlink signals for antenna 430. Port A' of the duplexer device 425 is a bidirectional port. In one direction, it couples the uplink signals, Rx1, of the first frequency band and Rx2 of the second frequency band from antenna 430, into their respective filters, RX21 and RX22. In the other direction, it couples the amplified downlink signals, Tx1 and Tx2 of both frequency bands from their respective filters, TX21 and TX22 to the antenna 430. Port B' of duplexer device 425 can couple the amplified downlink signals, Tx1 and Tx2, of both frequency bands from downlink amplifier 415 to their respective filters, TX21 and TX22. Port C', is capable of coupling and matching the two reception uplink signals, Rx1 and Rx2, from their respective filters, RX21 and RX22, to uplink amplifier 420.

Like duplexer device 410, duplexer device 425 is configured to pass the uplink and downlink signals of the two desired frequency bands and can direct the signals such that each signal can only pass through its designated path. In a non-limiting example, the uplink signal, Rx1, of the first frequency band can be input at Port A' and output at Port C' of the duplexer device 425 through its RX21 filter, while the amplified downlink signal, Tx1, of the first frequency band can be input at Port B' and output at Port A' through its TX21 filter. Similarly, the uplink signal, Rx2, of the second frequency band can be input at Port A' and output at Port C' of the duplexer device 425 through its RX22 filter and the amplified downlink signal, Tx2, of the second frequency band can be input at Port B' and output at Port A' through its TX22 filter from downlink amplifier 415.

Figure 5A:
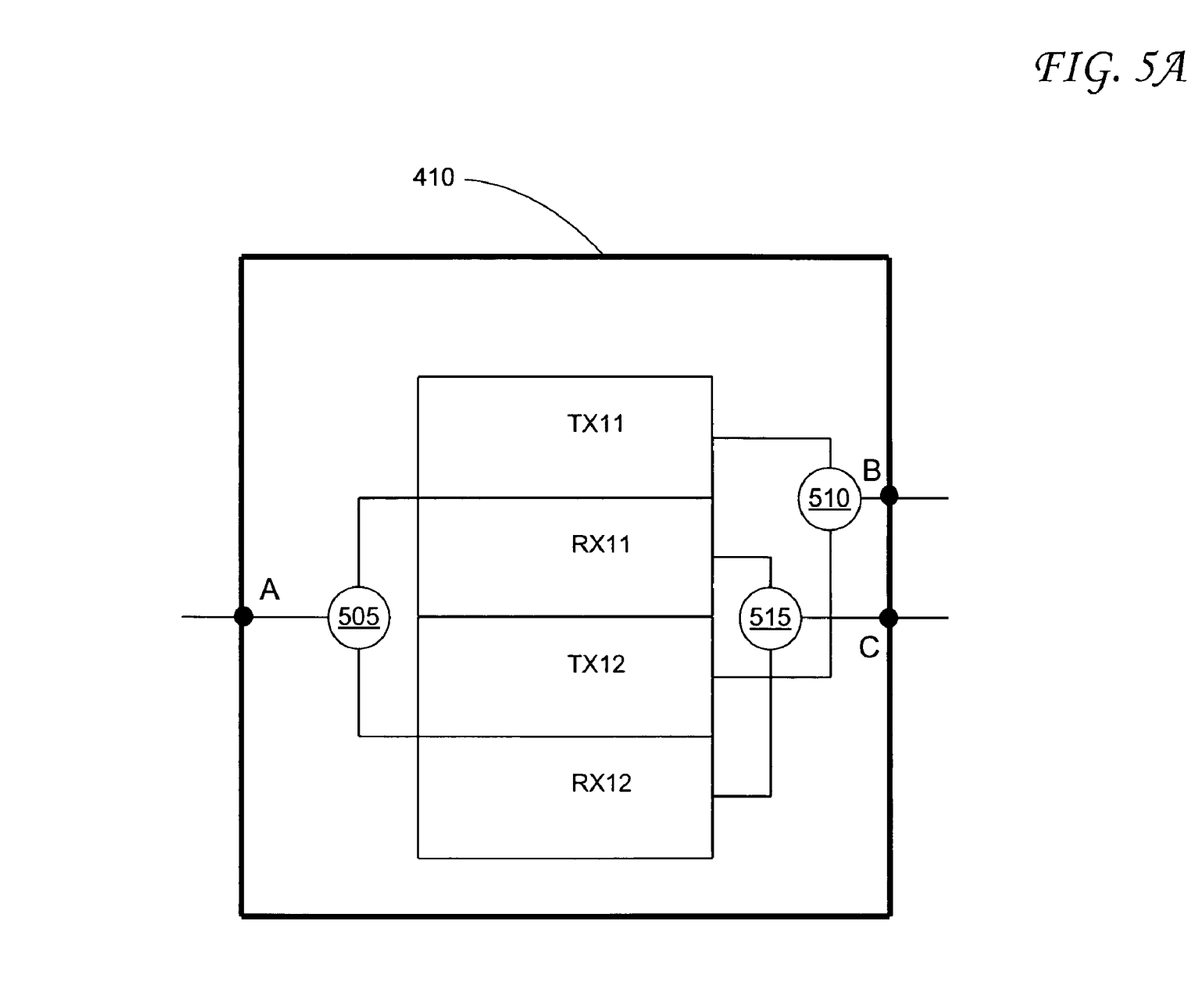
FIG. 5A displays an expanded view of duplexer device 410 used in dual band bidirectional amplification device 400 in accordance with an exemplary embodiment of the present invention.

FIG. 5A displays an expanded view of duplexer device 410 used in dual band bidirectional amplification device 400, in accordance with an exemplary embodiment of the present invention. The ability of the duplexer device, such as the exemplary embodiment of duplexer device 410, utilized in the embodiments of the present invention to internally process and match signals from multiple frequency bands eliminates certain components typically found in conventional band amplification devices. For example, the duplexer device utilized in various embodiments of the present invention eliminates the need for a circulator to separate and route the signals to multiple duplexers. Additionally, the duplexer device utilized in the embodiments of the present invention eliminates the need for T-cable components or similar devices to separate and feed signals between the amplifier chain and the duplexers.

Therefore, the duplexer device 410 can be enabled, in accordance with an exemplary embodiment of the present invention, to process signals in multiple frequency bands. As shown in FIG. 5A, in an exemplary embodiment, when the separation between the first frequency band and second frequency band are relatively close, the duplexer device 410 can include common resonators, 505, 510, and 515, in communication with the input/output Ports, A, B, and C, of the duplexer device. For example, and not limitation, the duplexer device 410 can be configured in a dual band bidirectional amplification device 400 enabled to process signals in the 800 MHz band and the 900 MHz band.

In this exemplary embodiment, common resonator 505 is designed to couple four signals, Tx1, downlink signal of the first frequency band, Tx2, downlink signal of the second frequency band, Rx1, uplink signal of the first frequency band, and Rx2, uplink signal of the second frequency band. Common resonator 510 at Port B is designed to couple two downlink signals, Tx1 and Tx2, of the first frequency band and second frequency band. Similarly, common resonator 515 is designed to couple two uplink signals, Rx1 and Rx2, of the first frequency band and second frequency band.

Figure 5B:
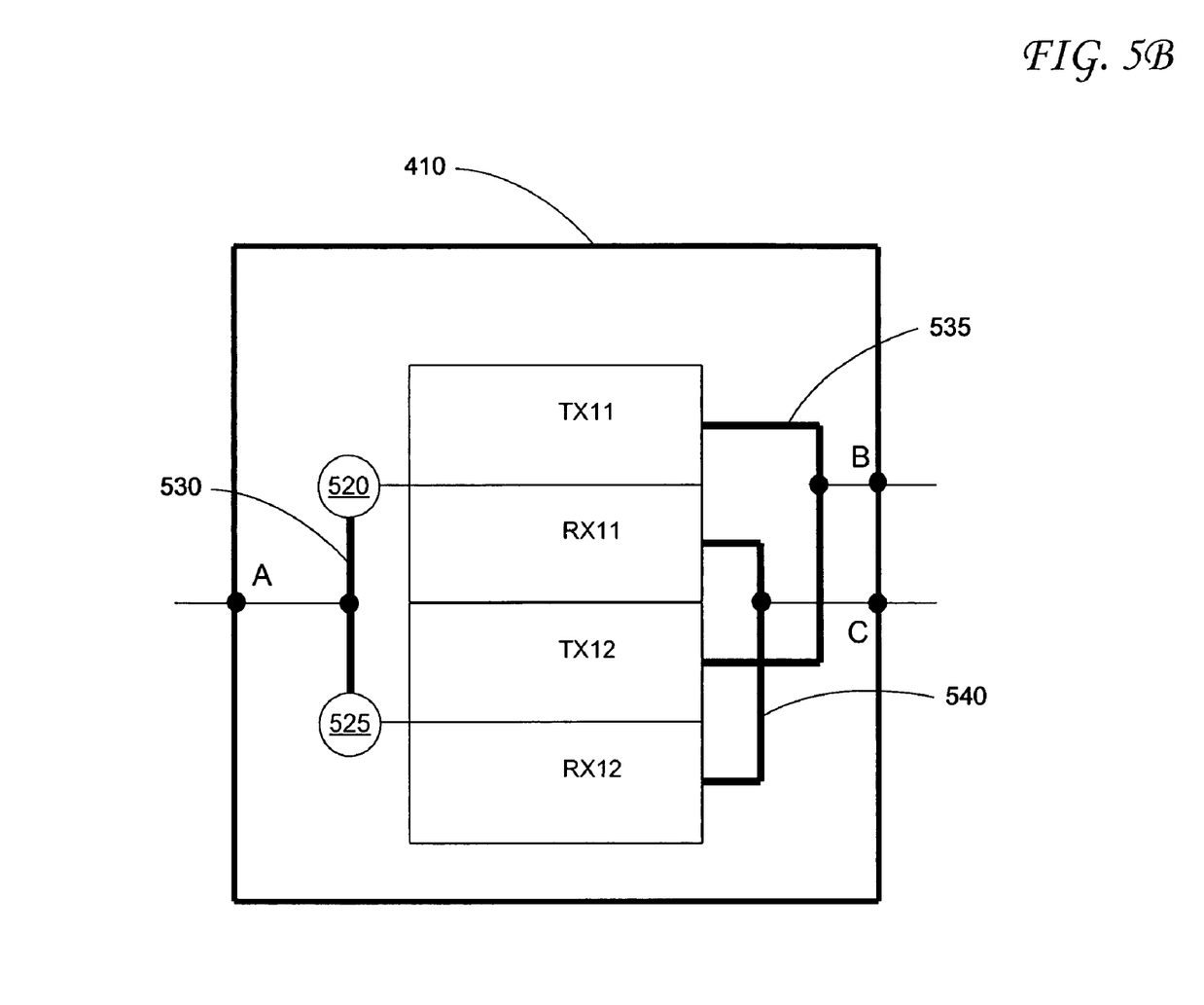
FIG. 5B displays a duplexer device 410 used in dual band bidirectional amplification device 400, in accordance with an alternative embodiment of the present invention.

FIG. 5B displays a duplexer device 410 used in dual band bidirectional amplification device 400, in accordance with an alternative embodiment of the present invention. The duplexer device 410 shown in FIG. 5A was configured for amplification of two frequency band signals that are relatively close in frequency. The alternative embodiment of the duplexer device 410 illustrated in FIG. 5B is configured to be enabled to process frequency band signals that are not relatively close in frequency and are therefore in excess of the coupling capacity of a common resonator. For example, and not limitation, the duplexer device 410 can be configured in a dual band bidirectional amplification device 400 enabled to process signals in the 800 MHz band and the 1900 MHz band. In the alternative embodiment depicted in FIG. 5B, the duplexer device 410 includes Internal Matching RF Wires, 530, 535, and 540 and common resonators, 520 and 525.

As illustrated in FIG. 5B, Port A can connect to Internal Matching RF Wire 530 that links with two common resonators, 520 and 525. Common resonator 520 can couple the downlink signal, Tx1, and the uplink signal, Rx1, of the first frequency band. Common resonator 525 can couple the downlink signal, Tx2, and the uplink signal, Rx2, of the second frequency band. Internal Matching RF Wire 530 can then match and provide the signal path for the uplink and downlink signals of both frequency bands for transmission and reception. For Port B, Internal Matching RF Wire 525 connects downlink signal filter, TX11 and TX12, and provides the downlink signal path for the first frequency band and second frequency band downlink signals, Tx1 and Tx2. Similarly, for Port C, an Internal Matching RF Wire 540 connects uplink signal filters, RX11 and RX12, and provides the uplink signal path for the first frequency band and second frequency band uplink signals, Rx1 and Rx2.

Duplexer device 425 can be configured in a manner similar to that of duplexer device 410. More particularly, the two implementations of duplexer device 410 illustrated in FIG. 5A and FIG. 5B can be implemented in duplexer device 425.

In an exemplary embodiment of the present invention, the dual band bidirectional amplification device 400 reduces the component count in comparison to the conventional dual band bidirectional amplifier 300 by two circulators, and four T-cables. The elimination of many of the components of the band amplification device results in significant improvements over the prior art. Notably, the dual band bidirectional amplification device 400 implemented in accordance with an exemplary embodiment of the present invention has reduced power loss and gain loss compared to the dual band amplifiers of the prior art. In an exemplary embodiment, the dual band bidirectional amplification device 400 has less loss than the dual band bidirectional amplifier 300 shown in FIG. 3. due to the elimination of interconnecting components. The reduction in power loss results in a more efficient amplification device; thus, a decreased operating cost. Additionally, the removal of RF interconnecting components serves to reduce the complexity of the overall system. Therefore, the removal of components reduces the cost of the system. For example, and not limitation, the component costs in the dual band bidirectional amplification device 400 are primarily the cost of two dual-duplexers and one amplifier chain.

In an exemplary embodiment of the present invention shown in FIG. 4, both the downlink amplifier 415 and the uplink amplifier 420 can be wide band amplifiers capable of amplifying frequencies in multiple ranges. Therefore, the downlink amplifier 415 and the uplink amplifier 420 can amplify both the first frequency band and the second frequency band signals. In a non-limiting example, the downlink amplifier 415 and the uplink amplifier 420 can amplify signals in the 800 MHz band and in the 900 MHz band. In alternative embodiments, the downlink amplifier 415 and the uplink amplifier 420 can amplify signals in various other frequency bands.

The present invention of system and method for providing band amplification with minimal interconnecting components is not limited to only the dual band amplification. It is applicable to signal amplification in bidirectional amplifier for more than two frequency bands.

Figure 6:
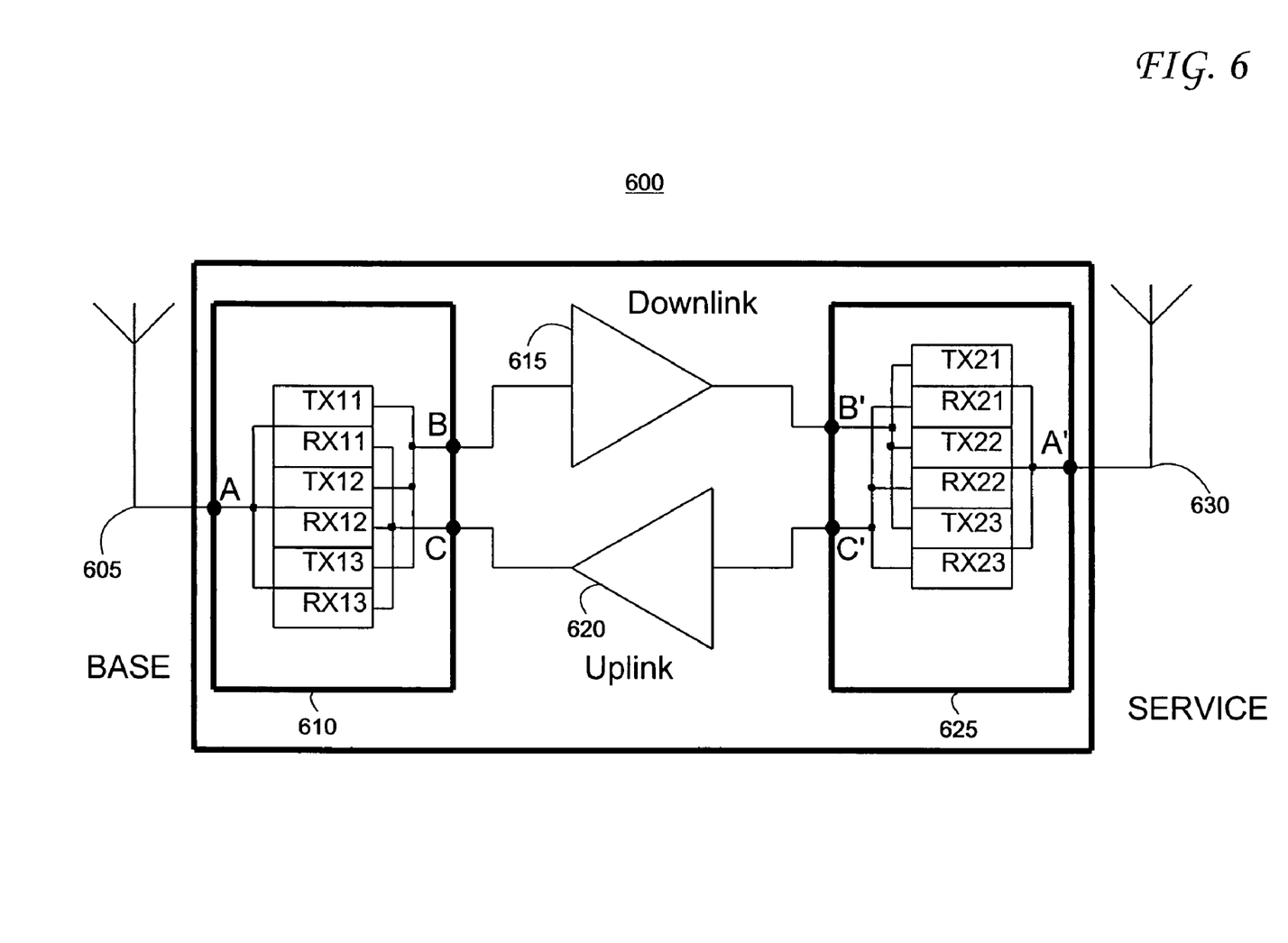
FIG. 6 displays a triple band bidirectional amplification device 600 in accordance with an exemplary embodiment of the present invention.

FIG. 6 displays a triple band bidirectional amplification device 600 in accordance with an exemplary embodiment of the present invention. Notably, the triple band bidirectional amplification device 600 contains two duplexer devices and one amplifier chain. In the exemplary embodiment depicted in FIG. 6, the triple band bidirectional amplification device 600 includes duplexer device 610 and duplexer device 625. In an exemplary embodiment, both duplexer devices can be tri-duplexers with three ports. For example, duplexer device 610 has ports A, B, and C. The port A is a bidirectional common port capable of coupling six signals, the uplink and downlink signals of a first frequency band, the uplink and downlink signals of a second frequency band and the uplink and downlink signals of a third frequency band. Port B is an output port to transmit downlink signals of all three-frequency bands into the downlink amplifier 615. Port C is an input port that receives amplified uplink signals of all three-frequency bands from uplink amplifier 620.

Those of skill in the art will appreciate that the first, second, and third frequency bands can be a number of different suitable frequencies used in wireless system configurations.

The duplexer device 610, shown in FIG. 6, provides signal path for both the downlink and uplink signals of the first, second and third frequency bands for antenna 605. Port A of the duplexer device 610 is a bidirectional port. In one direction, it couples and connects the downlink signals, Tx1, Tx2 and Tx3 of the first, second and third frequency bands from antenna 605, to their respective filters, TX11, TX12 and TX13. In the other direction, it couples the uplink signals, Rx1, Rx2 and Rx3 of the first, second and third frequency bands from their respective filters, RX11, RX12 and RX13 to the antenna 605. Port B of duplexer device 610 can couple and match the downlink signals, Tx1, Tx2 and Tx3, of the first, second and the third frequency bands to downlink amplifier 615. The reception port of duplexer device 610, Port C, is capable of coupling and connecting the amplified uplink signals, Rx1, Rx2 and Rx3, from uplink amplifier 620 to their respective filters, RX11, RX12 and RX13.

Duplexer device 610 is configured to pass the uplink and downlink signals of the three desired frequency bands and can direct the signals such that each signal can only pass through its designated path. In a non-limiting example, the downlink signal, Tx1, of the first frequency band can be input at Port A and output at Port B of the duplexer device 610 through its TX11 filter, while the uplink signal, Rx1, of the first frequency band can be input at Port C and output at Port A through its RX11 filter. Similarly, the downlink signal, Tx2, of the second frequency band can be input at Port A and output at Port B of the duplexer device 610 through its TX12 filter and the uplink signal, Rx2, can be input at Port C and output at Port A through its RX12 filter. Also, the downlink signal, Tx3, of the third frequency band can be input at Port A and output at Port B of the duplexer device 610 through its TX13 filter and the uplink signal, Rx3, can be input at Port C and output at Port A through its RX13 filter.

In an exemplary embodiment, the duplexer device 625 on the service side of the triple band bidirectional amplification device 600 is implemented in much the same way as duplexer device 610. Like duplexer device 610, duplexer device 625 has three ports, A', B', can C', The duplexer device 625, shown in FIG. 6, provides signal path for both downlink and uplink signals of the first, second, and third frequency band for antenna 630. Port A' of the duplexer device 625 is a bidirectional port. In one direction, it couples the uplink signals, Rx1, Rx2, and Rx3, of the first, second and third frequency bands from antenna 630, and connects them to their respective filters, RX21, RX22 and RX23. In the other direction, it couples the amplified downlink signals, Tx1, Tx2 and Tx3, of the first, second and the third frequency bands from their respective filters, TX21, TX22 and TX23, to the antenna 630. The reception port of duplexer device 625, Port B' can couple and connect the amplified downlink signals, Tx1, Tx2 and Tx3, of the three frequency bands from downlink amplifier 615 to their respective filters, TX21, TX22 and TX23. While, Port C', is capable of coupling and matching three uplink signals, Rx1, Rx2 and Rx3, from their respective filters, RX21, RX22 and RX23 to uplink amplifier 620.

Like duplexer device 610, duplexer device 625 is configured to pass the uplink and downlink signals of the three desired frequency bands and can direct the signals such that each signal can only pass through its designated path. In a non-limiting example, the uplink signal, Rx1, of the first frequency band can be input at Port A' and output at Port C' of the duplexer device 625 through its RX21 filter, while the amplified downlink signal, Tx1, of the first frequency band can be input at Port B' and output at Port A' through its TX21 filter. Similarly, the uplink signals, Rx2 and Rx3 of the second and third frequency bands can be input at Port A' and output at Port C' of the duplexer device 625 through their respective filters, RX22 and RX23, and the amplified downlink signals, Tx2 and Tx3, of the second and third frequency bands can be input at Port B' and output at Port A' through their respective filters, TX22 and TX23, from downlink amplifier 615.

Figure 7A:
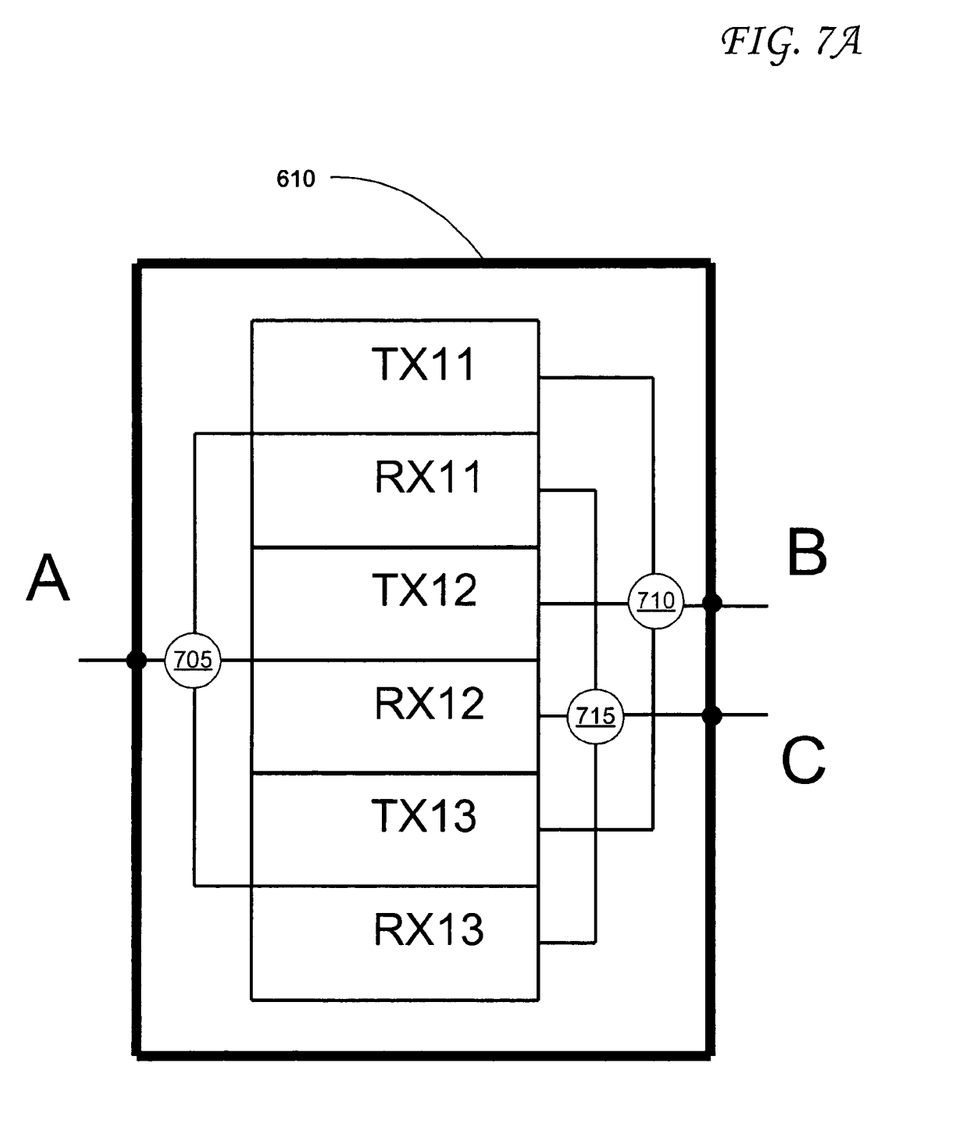
FIG. 7A displays an expanded view of duplexer device 610 used in triple band bidirectional amplification device 600 in accordance with an exemplary embodiment of the present invention.

FIG. 7A displays an expanded view of duplexer device 610 used in triple band bidirectional amplification device 600 in accordance with an exemplary embodiment of the present invention. The ability of the tri-duplexer utilized in the embodiments of the present invention, such as the exemplary embodiment of duplexer device 610, to internally process and match signals from multiple frequency bands eliminates certain components typically found in conventional band amplification devices. This is especially important for triple band amplification devices, because the amount of component would otherwise significantly increase the complexity and power loss of the band amplification system.

The duplexer devices utilized in the embodiments of the present invention can eliminate the need for a circulator device to separate and route the signals to multiple duplexers. Additionally, the duplexer devices utilized in the embodiments of the present invention eliminate the need for a T-cable component or similar device to separate and feed signals between the amplifier chain and the duplexers.

Therefore, the duplexer device 610 can be enabled, in accordance with an exemplary embodiment of the present invention, to process signals in multiple frequency bands. As shown in FIG. 7A, in an exemplary embodiment, when the separation between the three frequency bands is relatively close, the duplexer device 610 can include common resonators, 705, 710, and 715, in communication with the Ports, A, B, and C, of the duplexer device. For example, and not limitation, the duplexer device 610 can be configured in a triple band bidirectional amplification device 600 enabled to process signals in three frequency bands that are relatively close in the frequency spectrum.

In this exemplary embodiment, common resonator 705 is designed to couple six signals, Tx1, downlink signal of the first frequency band, Tx2, downlink signal of the second frequency band, Tx3, downlink signal of the third frequency band, Rx1, uplink signal of the first frequency band, Rx2, uplink signal of the second frequency band, and Rx3, uplink signal of the third frequency band. Common resonator 710 at Port B is designed to couple three downlink signals, Tx1, Tx2, and Tx3, from their respective filters, Tx11, Tx12, and Tx13, of the first, second, and third frequency bands. Similarly, common resonator 715 is designed to couple three uplink signals, Rx1, Rx2 and Rx3, of the first, second, and third frequency bands and connect them to their respective filters, Rx11, Rx12, and Rx13.

Figure 7B:
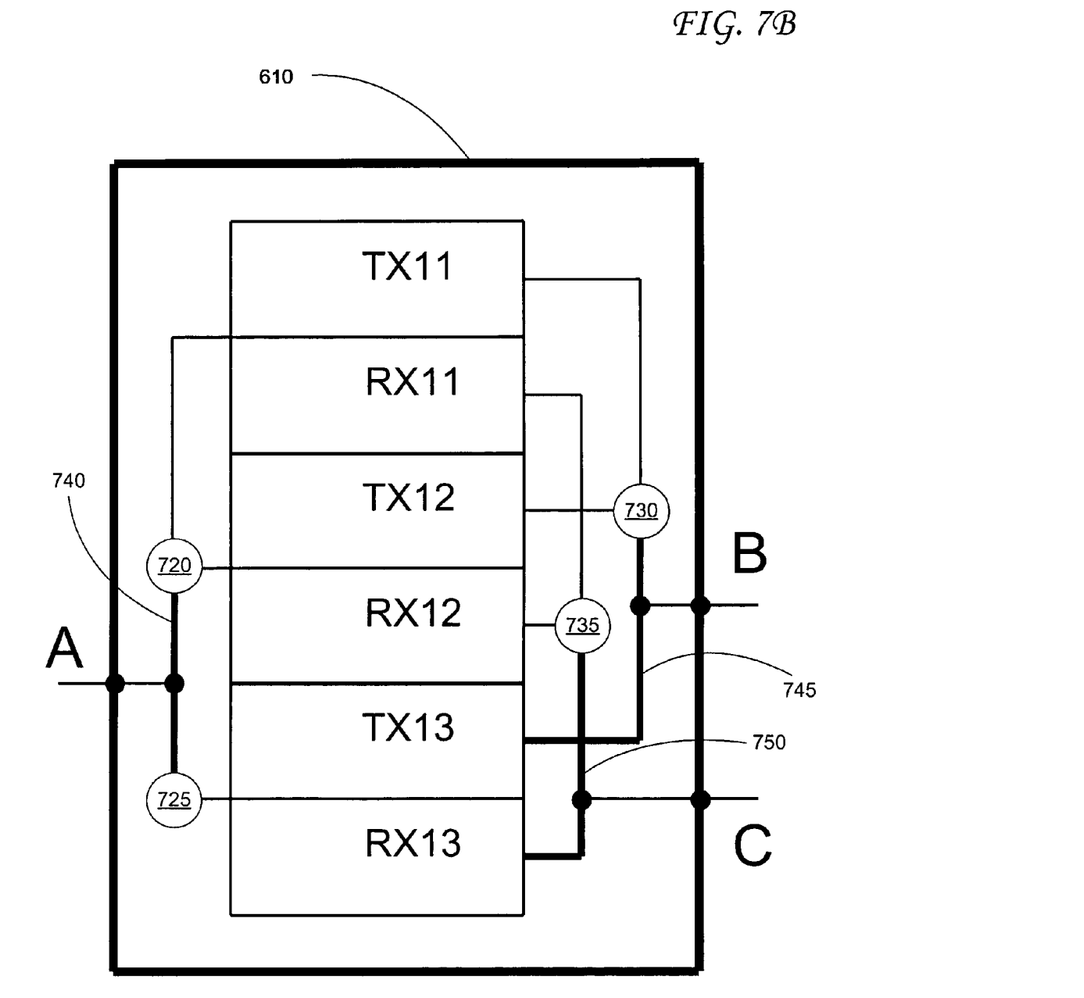
FIG. 7B displays a duplexer device 610 used in a triple band bidirectional amplification device 600, in accordance with an alternative embodiment of the present invention.

FIG. 7B displays a duplexer device 610 used in a triple band bidirectional amplification device 600, in accordance with an alternative embodiment of the present invention. The duplexer device 610 shown in FIG. 7A was configured for amplification of three frequency band signals that are relatively close in frequency. The alternative embodiment of the duplexer device 610 illustrated in FIG. 7B is configured to be enabled to process frequency band signals that are not relatively close in frequency and are therefore in excess of the coupling capacity of a common resonator. For example, and not limitation, the duplexer device 610 can be configured in a triple band bidirectional amplification device 600 enabled to process signals in the 800 MHz band, the 900 MHz band, and the 1900 MHz band. In the alternative embodiment depicted in FIG. 7B, the duplexer device 610 includes an Internal Matching RF Wires, 740, 745, 750 and common resonator, 720, 725, 730, and 735.

As illustrated in FIG. 7B, Port A can connect to Internal Matching RF Wire 740 that links with two common resonators, 720 and 725. Common resonator 720 can couple the downlink signals, Tx1 and Tx2, and the uplink signals, Rx1 and Rx2, of the first and second frequency bands. Common resonator 725 can couple the downlink signal, Tx3, and the uplink signal, Rx3, of the third frequency band. Internal Matching RF Wire 740 can link common resonators 720 and 725, thereby permitting the uplink and downlink signals of all three frequency bands to be passed by Port A. Common resonator 730 can connect to downlink filters, TX11 and TX12, and couple the downlink signals of the first and second frequency band, Tx1 and Tx2. Internal Matching RF Wire 745 can connect downlink signal filter TX13 of the third frequency band and common resonator 730 and provide the downlink signal path for the first, second, and third frequency band downlink signals, Tx1, Tx2, and Tx3 via Port B. Internal Matching RF Wire 750 can connect uplink signal filter RX13 of the third frequency band and common resonator 735 to provide the uplink signal path via Port C for all three frequency band uplink signals, Rx1, Rx2, and Rx3. Common resonator 735 can connect to uplink filters, RX11 and RX12, and couples the uplink signals of the first and second frequency band, Rx1 and Rx2.

Duplexer device 625 can be configured in a manner similar to that of duplexer device 610. More particularly, the two implementations of duplexer device 610 illustrated in FIG. 7A and FIG. 7B can be implemented in duplexer device 625.

In an exemplary embodiment of the present invention shown in FIG. 6, triple band bidirectional amplification device 600 has only one bidirectional amplifier chain. Thus, both the downlink amplifier 615 and the uplink amplifier 620 are wide band amplifiers capable of amplifying signals in three frequency bands. Enabling broad amplification functionality with only an amplifier chain overcomes many drawbacks of the prior art. For example, and not limitation, the triple band bidirectional amplification device 600 has significantly less power loss. In an exemplary embodiment, the triple band bidirectional amplification device 600 has less loss than the conventional dual band bidirectional amplification device 300 shown in FIG. 3. Notably, the single amplifier chain of the triple band bidirectional amplification device 600 requires one third of the DC power compared with conventional triple band bidirectional amplification device that employs three separated amplifier chains. Furthermore, elimination of multiple amplifier chains and RF inter connection components significantly decreases the system complexity. Additionally, the simplified architecture of triple band bidirectional amplification device 600 results in a lower cost and a compact device.

Numerous characteristics and advantages have been set forth in the foregoing description, together with details of structure and function. While the invention has been disclosed in several forms, it will be apparent to those skilled in the art that many modifications, additions, and deletions, especially in matters of shape, size, and arrangement of parts, can be made therein without departing from the spirit and scope of the invention and its equivalents as set forth in the following claims. Therefore, other modifications or embodiments as may be suggested by the teachings herein are particularly reserved as they fall within the breadth and scope of the claims here appended.

What is claimed is:

1. A multi-band amplification device comprising:
   an uplink amplifier, having a first uplink port and a second unlink port;
   a downlink amplifier, having a first downlink port and a second downlink port;
   a first duplexer device in communication with the first downlink port of the downlink amplifier and the second uplink port of the uplink amplifier, wherein the first duplexer device further comprises:
      a first port that receives and transmits at least a downlink signal and an uplink signal of first, second, and third frequency bands;
      a second port that receives or transmits a downlink signal and an uplink signal of first, second, and third frequency bands; and
      a third port that receives or transmits a downlink signal and an uplink signal of first, second, and third frequency bands;
   a second duplexer device in communication with the first uplink port of the uplink amplifier and the second downlink port of the downlink amplifier, wherein the second duplexer device further comprises:
      a fourth port that receives and transmits at least a downlink signal and an uplink signal of first, second, and third frequency bands;
      a fifth port that receives or transmits a downlink signal and an uplink signal of first second, and third frequency bands; and
      a sixth port that receives or transmits a downlink signal and an uplink signal of first, second, and third frequency bands.

2. The multi-band amplification device of claim 1, wherein the first frequency band is in the 800 MHz range, the second frequency band is in the 900 MHz range, and the third frequency band is in the 1900 MHz range.

3. The multi-band amplification device of claim 1, wherein the first frequency band is in the 800 MHz range and the second frequency band is in the 900 MHz range.

4. The multi-band amplification device of claim 1, wherein the first duplexer device and the second duplexer device include at least one common resonator that couples the downlink signal and the uplink signal of the first frequency band and the downlink signal and the uplink signal of the second frequency band.

5. The multi-band amplification device of claim 1, wherein the first duplexer device and the second duplexer device include at least one common resonator that couples the downlink signal and the uplink signal of the first frequency band, the downlink signal and the uplink signal of the second frequency band, and the downlink signal and the uplink signal of the third frequency band.

6. The multi-band amplification device of claim 5, wherein each port of the first duplexer device and each port of the second duplexer device is provided in communication with at least one common resonator.

7. The multi-band amplification device of claim 1, wherein the first duplexer device and the second duplexer device include at least one common resonator and at least one matching RF wire that couple the downlink signal and the uplink signal of the first frequency band and the downlink signal and the uplink signal of the second frequency band.

8. The multi-band amplification device of claim 1, wherein the first duplexer device and the second duplexer device include at least one common resonator and at least one matching RF wire that couple the downlink signal and the uplink signal of the first frequency band, the downlink signal and the uplink signal of the second frequency band, and the downlink signal and the uplink signal of the third frequency band.

9. A wireless telecommunication system comprising:
a triple band bidirectional amplification device that transmits and receives a plurality of signals in at least three frequency bands, the plurality of signals being simultaneously transmitted and received in a downlink direction and a uplink direction, wherein the triple band bidirectional amplification device includes a bidirectional amplifier chain having an uplink amplifier and a downlink amplifier; and wherein the bidirectional amplifier chain amplifies the plurality of signals in at least three frequency bands, wherein a first port receives or transmits a downlink signal and an uplink signal of first, second, and third frequency bands, a second port receives or transmits a downlink signal of first, second, and third frequency bands to or from the downlink amplifier, and a third port receives or transmits an uplink signal of first, second, and third frequency bands to or from the uplink amplifier.

10. The wireless telecommunication system of claim 9, further comprising:
a first duplexer device in communication with the uplink amplifier and the downlink amplifier and a second duplexer device in communication with the uplink amplifier and the downlink amplifier.

11. The wireless telecommunication system of claim 10, wherein the first duplexer device and the second duplexer device transmit and receive the plurality of signals in at least three frequency bands.

12. The wireless telecommunication system of claim 9, wherein the at least three frequency bands include a first frequency band in the 800 MHz range, a second frequency band in the 900 MHz range, and a third frequency band in the 1900 MHz range.

13. A duplexer device, for a multi-band amplification system, comprising:
a first port in communication with at least one antenna, the first port receiving and transmitting a downlink signal and an uplink signal of a first frequency band and a downlink signal and an uplink signal of a second frequency band;
a second port in communication with a downlink amplifier, the second port receiving or transmitting the downlink signal of the first frequency band and the downlink signal of the second frequency band to or from the downlink amplifier; and
a third port in communication with an uplink amplifier, the third port receiving or transmitting an uplink signal of the first frequency band and an uplink signal of the second frequency band to or from the uplink amplifier wherein the first port further receives and transmits a downlink signal and an uplink signal of a third frequency band, the second port further receives or transmits a downlink signal of the third frequency band to or from the downlink amplifier, and the third port further receives or transmits an uplink signal of the third frequency band to or from the uplink amplifier.

14. A duplexer device, for a multi-band amplification system, comprising:
a first port in communication with at least one antenna, the first port receiving and transmitting a downlink signal and an uplink signal of a first frequency band and a downlink signal and an uplink signal of a second frequency band;
a second port in communication with a downlink amplifier, the second port receiving or transmitting the downlink signal of the first frequency band and the downlink signal of the second frequency band to or from the downlink amplifier;
a third port in communication with an uplink amplifier, the third port for receiving or transmitting an uplink signal of the first frequency band and an uplink signal of the second frequency band to or from the uplink amplifier;
a first common resonator in communication with the first port to couple the downlink signal and the uplink signal of the first frequency band and the downlink signal and the uplink signal of the second frequency band;
a second common resonator in communication with the second port to couple the downlink signal of the first frequency band and the downlink signal of the second frequency band; and
a third common resonator in communication with the third port to couple the uplink signal of the first frequency band and the uplink signal of the second frequency band.

* * * * *

UNITED STATES PATENT AND TRADEMARK OFFICE
CERTIFICATE OF CORRECTION

PATENT NO. : 7,903,592 B2  Page 1 of 1
APPLICATION NO. : 11/681392
DATED : March 8, 2011
INVENTOR(S) : Liping Zhen and Xiangqing Xu It is certified that error appears in the above-identified patent and that said Letters Patent is hereby corrected as shown below:

Column 12, line 29, Claim 1, please change "unlink" to --uplink--.

Signed and Sealed this
Twenty-sixth Day of April, 2011

David J. Kappos
*Director of the United States Patent and Trademark Office*